United States Patent
Bieth et al.

(10) Patent No.: US 8,151,169 B2
(45) Date of Patent: Apr. 3, 2012

(54) METHOD AND DEVICE FOR SECURING THE MEMORY OF A COMPUTER AGAINST ERRORS DUE TO RADIATION

(75) Inventors: Philippe Bieth, Saclay (FR); Sebastien Tricot, Plaisir (FR)

(73) Assignee: Thales (FR)

( * ) Notice: Subject to any disclaimer, the term of this patent is extended or adjusted under 35 U.S.C. 154(b) by 821 days.

(21) Appl. No.: 12/299,331

(22) PCT Filed: Apr. 24, 2007

(86) PCT No.: PCT/EP2007/053976
§ 371 (c)(1),
(2), (4) Date: Nov. 3, 2008

(87) PCT Pub. No.: WO2007/128683
PCT Pub. Date: Nov. 15, 2007

(65) Prior Publication Data
US 2009/0204870 A1     Aug. 13, 2009

(30) Foreign Application Priority Data
May 5, 2006  (FR) ..................... 06 04052

(51) Int. Cl.
*G06F 11/00* (2006.01)
(52) U.S. Cl. ........................ 714/777; 714/763
(58) Field of Classification Search ........................ None
See application file for complete search history.

(56) References Cited

U.S. PATENT DOCUMENTS

| 5,357,527 | A | 10/1994 | Coates et al. |
|---|---|---|---|
| 5,754,563 | A | 5/1998 | White |
| 6,204,786 | B1 | 3/2001 | Bieth et al. |
| 7,987,514 | B2 * | 7/2011 | Shamoon .................. 726/27 |
| 2004/0161031 | A1 * | 8/2004 | Kwentus et al. ............. 375/240 |
| 2005/0172207 | A1 | 8/2005 | Radke et al. |
| 2006/0210077 | A1 * | 9/2006 | Shamoon .................. 380/232 |

FOREIGN PATENT DOCUMENTS

| EP | 0176218 | 4/1986 |
|---|---|---|
| EP | 0191410 | 8/1986 |

* cited by examiner

*Primary Examiner* — Michael Maskulinski
(74) *Attorney, Agent, or Firm* — Lowe Hauptman Ham & Berner, LLP

(57) ABSTRACT

The method is for hardening a computer based on off-the-shelf components so that it resists bombardment by particles of cosmic origin encountered at high altitude and near the poles. It relates more particularly to a computer comprising a processor/bridge pair, the bridge ensuring auxiliary functions for controlling the data exchanges between the processor and a random-access memory incorporating a Hamming-type error corrector code into the information exchanged and consists in inserting between the processor/bridge pair and the random-access memory an interface device carrying out a two-way transcoding between the Hamming-type error correction code incorporated into the information exchanged by the auxiliary functions for controlling the data exchanges of the processor/bridge pair and a Reed-Solomon-type error correction code adapted to the architecture of the random-access memory.

7 Claims, 2 Drawing Sheets

METHOD AND DEVICE FOR SECURING THE MEMORY OF A COMPUTER AGAINST ERRORS DUE TO RADIATION

CROSS-REFERENCE TO RELATED APPLICATIONS

The present Application is based on International Application No. PCT/EP2007/053976, filed on Apr. 24, 2007, which in turn corresponds to French Application No. 0604052, filed on May 5, 2006, and priority is hereby claimed under 35 USC §119 based on these applications. Each of these applications are hereby incorporated by reference in their entirety into the present application.

FIELD OF THE INVENTION

The invention relates to the hardening of computers subjected to bombardment by particles, such as for example computers which are carried on board satellites or aircraft cruising at high altitudes, exposed to a flux of neutrons arising mainly from the interaction of cosmic rays and solar winds with the outermost layers of the terrestrial atmosphere.

BACKGROUND OF THE INVENTION

The effects of concentration due to the lines of the terrestrial magnetic field and of attenuation due to the terrestrial atmosphere mean that the consequences of bombardment by particles of cosmic origin on the electronic equipment are marginal at sea level in the tropical or temperate regions where the major part of the globe's population is concentrated. This is no longer the case at the low latitudes in the vicinity of the poles or at high altitudes where the density of neutrons is about 1000 times as great.

The electronic equipment of satellites which cruise at very high altitude and aircraft which may be required during long-haul flights to cruise for long periods at low latitudes and at high altitudes must therefore be designed to resist the stresses related to bombardment by particles of cosmic origin. Such is not the case for off-the-shelf electronic equipment made in very large production runs and which are devised without taking account of stresses related to bombardment by particles of cosmic origin since they are developed to satisfy the widest possible markets situated in the temperate and tropical regions, at medium or low altitude.

In the aeronautical context, that is to say with a neutron bombardment intensity 1000 times as high as at sea level at medium latitudes, the off-the-shelf electronic components, notably of RAM (Random Access Memory) type, are presumed to be able to exhibit failures of the single event type SEU (the acronym standing for the expression: "Single Event Upset") consisting of the inversion of the content of an isolated bit, with a probability of about $10^{-8}$ per bit and per hour. Such a figure is unacceptable for computers fulfilling critical functions and calling upon memories with several million bits since the mean time between two failures, of the order of only a few tens of hours, is incompatible with the security objectives sought. Certain recent publications also describe the possibility of multiple errors M.E.U (the acronym standing for the expression: "Multiple Event Upset") consisting in the inversions of the contents of several bites on one and the same memory component with probabilities that are about 100 times lower.

To alleviate this kind of failure of off-the-shelf electronic components of memory type as well moreover as errors due to transmission noise, it is known to make the storage and transmission of information tolerant to errors by employing error corrector codes of "Hamming" or "Reed-Solomon" type which add a certain redundancy to the information stored or transmitted. The error corrector codes of Reed-Solomon type which are more redundant than the error corrector codes of Hamming type are particularly adapted to protection in relation to M.E.U. events insofar as they make it possible to correct consecutive errors and therefore multiple errors situated in one and the same memory component.

Computers call upon one or more electronic components termed "processors or central unit" exchanging information through physical links termed "system buses" or "internal buses" with electronic components of random-access memory type and through other physical links termed "expansion buses" or "input/output buses" with peripheral equipment. The auxiliary functions for controlling the data exchanges between central unit and central random-access memory as well as between central unit and peripheral equipment are termed "bridge" functions.

The "bridge" auxiliary functions are often entrusted with other auxiliary functions for specialized electronic components termed "North bridge or memory controller", "South bridge or input-output controller", which are designed to make it possible to effectively interconnect a central unit with random-access memories and peripheral equipment by best exploiting the cache architecture of the central unit and sequential modes of access to the memory making it possible to maximize the bandwidth.

Certain processor electronic components integrate the "bridge" functions directly by offering several bus interfaces and a memory controller interfacing directly with a bank of random-access memory components.

The most recent electronic components of "bridge" type or of processor type with integrated "bridge" functions also incorporate Hamming-type error corrector codes into the information exchanged with electronic components of random-access memory type, making it possible to correct any single fault (inversion of a bit) and to detect any failure affecting 2 bits but which may be upset by MEU multiple errors generally affecting an arbitrary number of bits inside one and the same random-access memory component, for which only the error corrector codes of Reed-Solomon type are effective.

For critical onboard applications, it is of course possible to develop a specific "bridge" electronic component furnished with error corrector codes of Reed-Solomon type. Nevertheless, this approach comes up against the following disadvantages:

since the market for a specific electronic component such as this, having a "bridge" function, is limited to the aeronautical and satellite sectors, it cannot generate the quantities that might allow amortization of its development which will moreover remain expensive and uncertain while producing a result below the performance achievable through an off-the-shelf product benefiting from the most recent technologies. Briefly, this development will be expensive and will give rise to an expensive product whose production lifetime will remain short;

on account of its specific nature, the component thus developed will not be able to exploit upgrades of off-the-shelf software which will preferably be based on electronic components aimed at a global market.

SUMMARY OF THE INVENTION

An object of the present invention is to solve these problems by proposing a hardware interface device that is independent of the processor/bridge pair and makes it possible to increase the error correction capability of a "bridge" function implemented in an off-the-shelf component.

Another object of the present invention is a not very complex device that can be embodied in a programmable logic circuit of medium complexity calling upon efficacious and low-cost technologies.

The invention is directed to a method for securing the memory of a computer comprising a processor/bridge pair, the bridge ensuring auxiliary functions for controlling the data exchanges between the processor and a random-access memory incorporating a Hamming-type error corrector code into the information exchanged. This method is noteworthy in that it consists in inserting between the processor/bridge pair and the random-access memory an interface device carrying out a two-way transcoding between the Hamming-type error correction code incorporated into the information exchanged by the auxiliary functions for controlling the data exchanges of the processor/bridge pair and a Reed-Solomon-type error correction code adapted to the architecture of the random-access memory.

Advantageously, the processor/bridge pair and interface device/random-access memory pair operate according to distinct and synchronous clock cycles, the clock period of the interface device/random-access memory pair being shorter than that of the processor/bridge pair and in an integer ratio, and the bridge being parametrizable in terms of latency cycle.

Advantageously, the interface device and the random-access memory operate at a nominal clock frequency that is a multiple of that of the bridge, in a ratio 2 or 3.

Advantageously, the interface device corrects in the random-access memory the data errors identified by the Reed-Solomon-type error correction code.

Advantageously, the interface device transposes a Reed-Solomon-type error correction code value that is characteristic of a presence of error in the coded data item into a Hamming-type error detection code value that is characteristic of a presence of detectable and correctable error in the coded data item, doing so in order to make the processor/bridge pair react.

The invention is also directed to a device for securing the memory of a computer comprising a processor/bridge pair with functions for controlling the data exchanges between the processor and a random-access memory incorporating Hamming-type error corrector codes into the information exchanged, noteworthy in that it comprises inserted between the processor/bridge pair and the random-access memory an interface device embodied in the form of a programmable logic array, ensuring a two-way transcoding between the Hamming-type error correction code incorporated into the information exchanged by the auxiliary functions for controlling the data exchanges of the processor/bridge pair and a Reed-Solomon-type error correction code adapted to the architecture of the random-access memory.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein.

a FIG. 1 represents a diagram for installing a device according to the invention between a processor/bridge pair and a random-access memory of a computer.

DETAILED DESCRIPTION OF PREFERRED EMBODIMENTS

Figure 1:
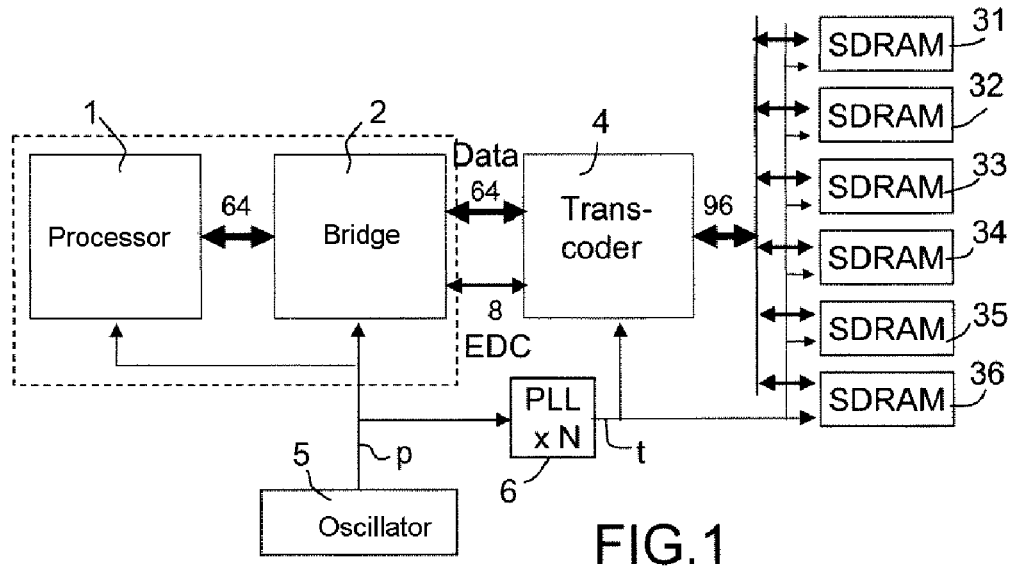

FIG. 1 depicts a processor 1/bridge 2 pair exchanging data with a random-access memory consisting of a parallel bank of six electronic components of SDRAM random-access memory type (the acronym standing for the expression: "Static Random Access Memory") 31 to 36 by way of a transcoder interface device 4, as well as a local oscillator 5 providing directly the clock signal of the processor 1/bridge 2 pair and indirectly the clock signal of the random-access memory components 31 to 36 and of the transcoder interface device 4 by way of a PLL phase locked oscillator 6 operating as frequency multiplier.

The processor 1 possesses a bus of 64 parallel bits that the bridge 2 expands to a bus of 72 parallel bits supplementing it with 8 additional parallel bits reserved for Hamming-type 8-bit error detection code EDC.

The transcoder interface device 4 implements for its part a Reed-Solomon-type 32-bit error detection code EDC, adapted to a random-access memory architecture consisting of six electronic components of SDRAM type 31 to 36 with individual data width of 16 parallel bits and exhibiting in total a bus width of 96 parallel bits: 64 bits for the data and the remainder for the Reed-Solomon-type 32-bit error detection code EDC. Embodied in the form of a programmable logic array, it associates a Hamming coder-decoder, with parallel architecture, with a Reed-Solomon coder-decoder with pipeline parallel architecture such as, for example, that described in U.S. Pat. No. 5,754,563 and makes it possible to correct all the multiple errors concentrated in one and the same component of the random-access memory.

Other architectures than that represented can be envisaged for generating the various clocks. It may in particular turn out to be judicious to exploit the PLL phase locked oscillators optionally present in the programmable circuit chosen to implement the transcoder interface device 4 to generate all the clocks.

Figure 2:
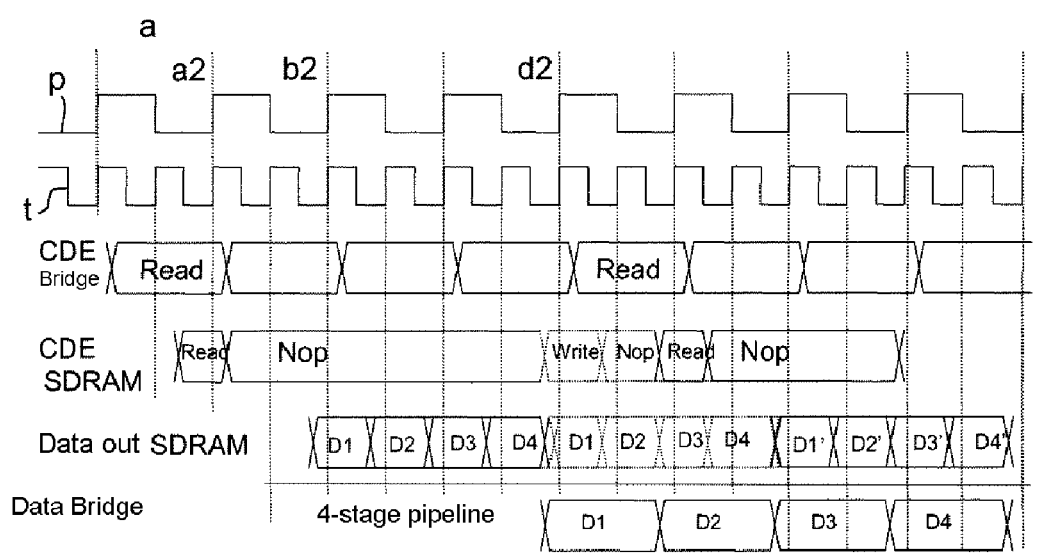
FIGS. 2, 3 and 4 are time charts illustrating several modes of possible operation of the device according to the invention shown in FIG. 1.

FIG. 2 is a time chart giving an operating timing diagram in relation to the clock signals p of the bridge 2 and t of the transcoder interface device 4 and of the random-access memory 31 to 36, for a bridge 2 configured with a latency parameter of 3 clock cycles, a memory configured with a latency parameter of 2 clock cycles, a clock signal frequency ratio between the bridge 2 and the random-access memory equal to 2 and a pipeline depth equal to 4.

A read or write order transmitted by the bridge 2 in the course of a period a of its clock signal p is transmitted by the transcoder interface device 4 to the random-access memory 31 to 36 in the course of the second part a2 of this period a. It is executed by the random-access memory 32 to 36, as regards the first 16 bits D1 of the data item at the end b2 of the second cycle of the clock signal p. These first 16 bits D1 are then processed by the transcoder interface device 4 which uses the four pipeline stages and renders them accessible to the bridge 2 at the end d2 of the fourth cycle of the clock signal p. The bridge 2 has a complete data item D1, D2, D3, D4 at its disposal seven clock signal cycles p after requesting it. It is noted that in the event of error, it is possible to insert a cycle for correcting a data item in the random-access memory 31 to 36 in a manner which is perfectly transparent to the bridge 2 and the processor 1 provided that the transcoder interface device 4 can undertake this correction cycle in the background relative to the read cycle.

Figure 3:
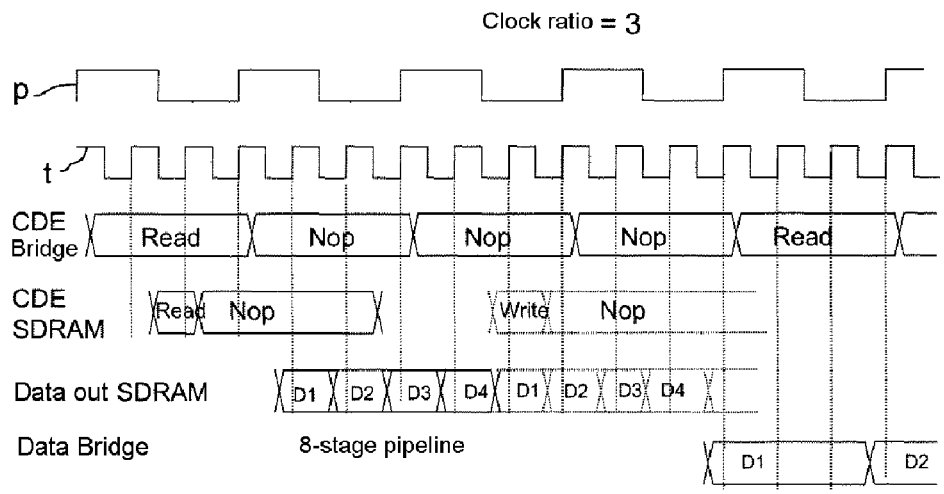

FIG. 3 is a variant of the operating timing diagram of FIG. 2 established, as previously, for a bridge 2 configured with a latency parameter of 3 clock cycles, a memory configured with a latency parameter of 2 clock cycles but with a clock signal frequency ratio between the bridge 2 and the random-access memory equal to 3 instead of 2 and with a pipeline depth equal to 8 instead of 4. The bridge 2 still has a complete data item D1, D2, D3, D4 at its disposal seven clock signal cycles p after requesting it since the doubling in the number of pipeline stages is compensated exactly by the increase in the frequency ratio of the clock signals. The difference comes here from the fact that it becomes possible to insert a cycle for correcting a data item in the random-access memory 31 to 36 in a manner which is perfectly transparent to the bridge 2 and the processor 1 without the transcoder interface device 4 having to undertake this correction cycle in the background relative to a read cycle.

It may be beneficial to use memory electronic components 31 to 36 with a width of 8 parallel bits and double depth, accessed in two cycles, this having the advantage of halving the width of the data bus on the component of the transcoder interface device 4. In this case, a pipeline stage will have to be used for the concatenation of the two half data.

Figure 4:
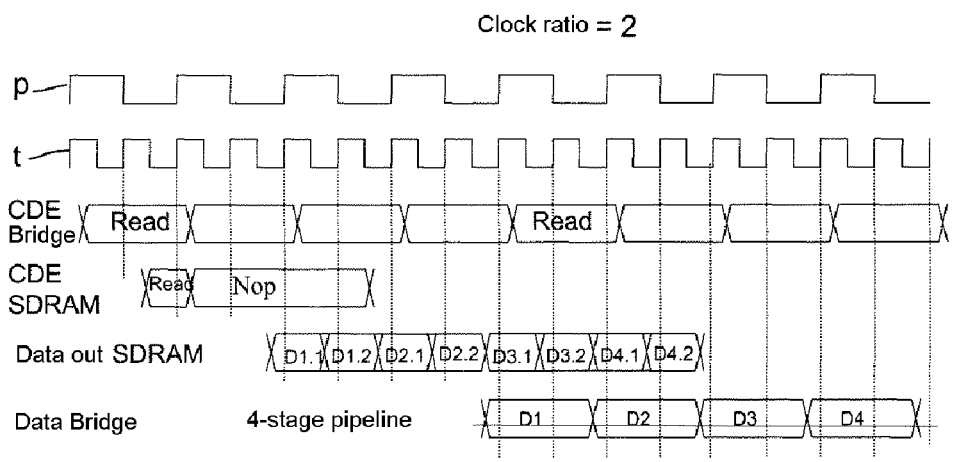

FIG. 4 illustrates the timing associated with such a solution for a clock signal frequency ratio of 2. In this case, it is no longer possible to carry out, in the random-access memory 31 to 36, an error correction transparent to the bridge 2 and the processor 1. The drawback of not correcting the errors at source is that in this case such errors may eventually accumulate and impair the detection and correction capability. It is nevertheless possible to force the bridge 2 and/or the processor 1 to perform a correction cycle by sending it a data item into which a single error detectable and correctable by the Hamming code has been wittingly inserted. Specifically in this case, the error detection and correction mechanisms specific to the bridge 2 or to the bridge-processor assembly 1, 2 will be implemented, causing a correction write cycle which will be taken into account by the transcoder like a conventional write cycle.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. A method for securing the memory of a computer comprising a processor/bridge pair, the bridge ensuring auxiliary functions for controlling the data exchanges between the processor and a random-access memory incorporating a Hamming-type error corrector code into the information exchanged, said method consisting in inserting between the processor/bridge pair and the random-access memory an interface device carrying out a two-way transcoding between the Hamming-type error correction code incorporated into the information exchanged by the auxiliary functions for controlling the data exchanges of the processor/bridge pair and a Reed-Solomon-type error correction code adapted to the architecture of the random-access memory.

2. The method as claimed in claim 1, wherein, the processor/bridge pair and interface device/random-access memory pair operate according to distinct and synchronous clock cycles, the clock period of the interface device/random-access memory pair being shorter than that of the processor/bridge pair and in an integer ratio, and the bridge being parametrizable in terms of latency cycle.

3. The method as claimed in claim 2, characterized in that the interface device (4) and the random-access memory (31 to 36) operate at a nominal clock frequency that is twice that of the bridge (2).

4. The method as claimed in claim 2, wherein the interface device and the random-access memory operate at a nominal clock frequency that is three times that of the bridge.

5. The method as claimed in claim 1, wherein the interface device corrects in the random-access memory the data errors identified by the Reed-Solomon-type error correction code.

6. The method as claimed in claim 1, wherein the interface device transposes a Reed-Solomon-type error correction code value that is characteristic of a presence of error in the coded data item into a Hamming-type error detection code value that is characteristic of a presence of detectable and correctable error in the coded data item, doing so in order to make the processor/bridge pair react.

7. A device for implementing the method as claimed in claim 1, comprising, inserted between the processor/bridge pair and the random-access memory, an interface device ensuring transcoding, embodied in the form of a programmable logic array.

* * * * *